INTEGRATED CIRCUIT DEVICE AND METHOD

Filed Aug. 7, 1964 2 Sheets-Sheet 1

INVENTOR
M. P. LEPSELTER
BY
H W Lockhart
ATTORNEY

Aug. 8, 1967 M. P. LEPSELTER 3,335,338

INTEGRATED CIRCUIT DEVICE AND METHOD

Filed Aug. 7, 1964

2 Sheets-Sheet 2

United States Patent Office 3,335,338

Patented Aug. 8, 1967

3,335,338

INTEGRATED CIRCUIT DEVICE AND METHOD

Martin P. Lepselter, New Providence, N.J., assignor to Bell Telephone Laboratories, Incorporated, New York, N.Y., a corporation of New York Filed Aug. 7, 1964, Ser. No. 388,039
4 Claims. (Cl. 317—234)

This invention relates to semiconductor devices and more particularly to integrated circuit devices and methods of making same.

This application is a continuation-in-part of my application Ser. No. 331,168, filed Dec. 17, 1963, now Patent 3,287,612 issued Nov. 22, 1966, and assigned to the same assignee as this application. In my application referred to above, there are disclosed techniques for applying metal films for the interconnection of portions of semiconductor devices. It is further disclosed that these metal films have several functions including as well as electrical interconnection, the functions of sealing and mechanical support. It is to this latter function that the invention of this application is particularly directed.

The art of integrated circuit semiconductor devices is rapidly developing and at present a primary consideration of this art is techniques for providing electrical isolation between the individual elements of such integrated arrays as pointed out, for example, in my joint application with D. A. Naymik, Ser. No. 345,696, now Patent No. 3,307,239 filed Feb. 18, 1964. The designer of an integrated circuit has the broad alternative of using a monolithic block of semiconductor material in which isolation between elements is provided by diffused conductivity type regions, or of fabricating the array from a plurality of individual semiconductor wafers or chips. In accordance with the monolithic approach, the isolation between individual elements depends upon the intervening conductivity type material and such devices are susceptible to electrical coupling across such barriers. While such coupling is acceptable for certain circuits and applications, in many cases absolute isolation between elements is necessary and the individual chip approach is followed. However, this technique heretofore has required the processing, handling and interconnection of individual semiconductor wafers of small size and there are limitations to the degree to which this approach can be used to closely pack individual circuit elements. Thus an approach is desired which provides the closely packed, high density arrangement achieved in the monolithic technique which at the same time offers the complete electrical isolation of the multiple chip configuration.

In accordance with this invention, an integrated circuit device is fabricated by producing initially within a monolithic block the various elements of the circuit after which heavy metal interconnections are applied between the individual elements or groups of elements on a surface of the monolith. Where necessary, these metal films are applied over oxide-coated surfaces of the device. Thereafter, the monolithic block is treated so as to completely remove the semiconductor material between the individual elements or groups of elements leaving the array of semiconductor wafers mechanically supported by the heavy metal interconnections. It will be understood that each wafer may contain one or more individual circuit elements, active or passive. Several alternative techniques will be disclosed for achieving this complete separation between individual elements.

Accordingly, a broad object of this invention is improved semiconductor integrated circuit devices.

A further object is more facile methods for producing such integrated circuit devices.

Typically, in accordance with one embodiment of this invention, a slice of semiconductor material is processed using well-known masking, etching and diffusion techniques to produce an array or plurality of individual circuit elements in accordance with a desired circuit configuration within the slice. On one face of the slice a pattern of metal film interconnections is deposited between the individual elements as defined by the desired circuit configuration. This pattern is applied over and through oxide coatings on the surface. In particular, the multiple metal layer arrangement of my application, of which this is a continuation-in-part, including, for example, successive layers of titanium, platinum and gold, may be used advantageously. Moreover, the thickness of gold is greatly increased in those areas comprising the boundaries between individual wafers of the integrated device. Then the opposite surface of the slice is masked in accordance with a pattern which is in registry with the elements of the integrated circuit so as to enable removal of the semiconductor material intervening between wafers. Such removal, for example, may be by means of chemical etching or by mechanical or electrical bombardment. The technique chosen must be one which does not erode the metal interconnections bridging the boundaries between elements. Typically, an etchant such as the standard hydrofluoric-nitric acid mixture used for removing silicon is suitably self-limiting. As a result of this removal operation, there is produced an integrated circuit array in which the wafers containing individual elements or groups of elements have been formed from a single block of original material but are now held in spaced apart array, mechanically supported and electrically connected by heavy metal interconnections.

The invention and further objects and various features thereof will be more clearly understood from the following detailed explanation taken in connection with the drawing in which.

Figure 1:
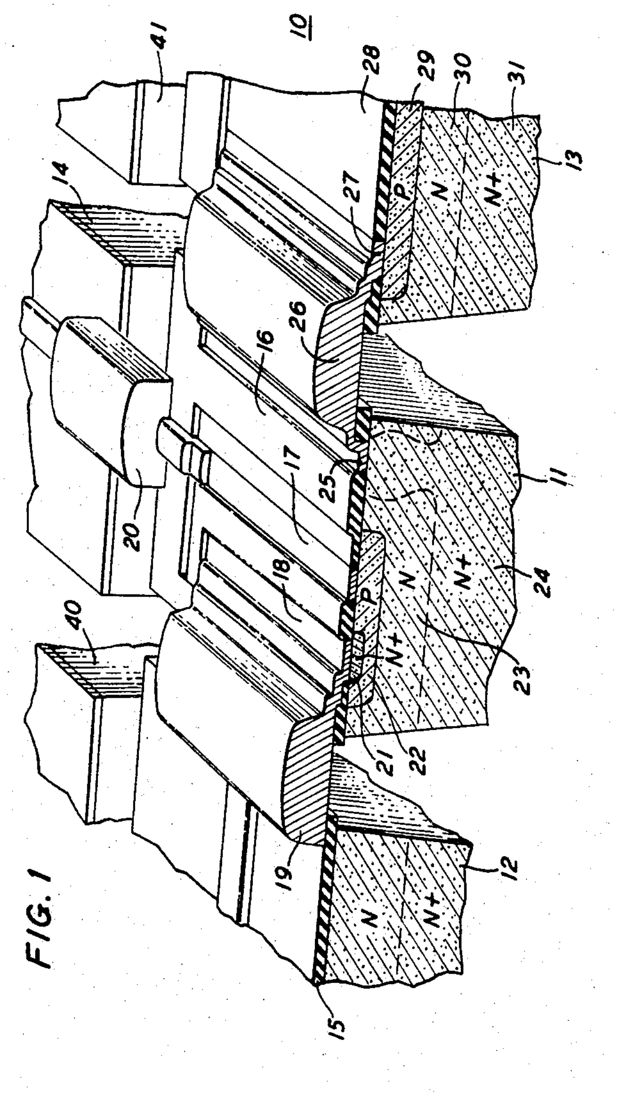
FIG. 1 is a perspective view, partially in section, of a portion of an integrated circuit device fabricated in accordance with this invention.

Referring to FIG. 1, there is shown portions of six wafers of an integrated circuit device. Obviously the drawing is not to scale and is exaggerated in certain portions to clarify the explanation. Only four of the wafers, 11, 12, 13 and 14, are shown to a sufficient extent to indicate their mechanical interconnection. The portions of the wafers 40 and 41 are indicated to suggest the possible extent of the array. In particular, the semiconductor wafers 11, 12, 13 and 14 may be of single crystal silicon produced initially from a slice having a thickness of about three to five mils and approximately one inch square.

As indicated by the sectioned portion of the figure, the semiconductor slice is subjected to a series of diffusion operations to produce planar semiconductor elements as called for by the particular circuit configuration. For example, the portion which comprises the final wafer 11 includes an N+ emitter region 21, intermediate P and N regions 22 and 23, respectively, on a substrate portion 24 of N+ material. This portion of the fabrication of the device will not be disclosed in detail inasmuch as it does not form a part of this invention. The techniques for such fabrication, including epitaxial deposition followed by masking and diffusion operations, are well known in the art at this time. Moreover, it will be understood that, in addition to active elements such as transistors and diodes, passive elements such as resistors and capacitors may be fabricated within the slice and included in the circuit. Also, a single wafer may contain more than one circuit element and, for example, may include both active and passive circuit elements.

Following the diffusion treatments, the semiconductor slice is provided with an array of metal film interconnections produced, for example, by vapor deposition through metal masks or on photoresist patterns. Referring to the drawing, each individual wafer is coated on one face by a film of silicon dioxide except for those portions on which metal electrodes are applied. Referring particularly to the individual wafer 11, connection is made to the N+ region 21 by means of the deposited metal film 18 and to the P-type region 22 by means of the metal film 17. Connection to the N+ type region 24 is by way of the metal electrode portion 25. Interconnection is then made to adjoining semiconductor elements as shown in the drawing, for example, in the case of the electrode 18 by way of the thickened metal portion 19 to the surface of the adjoining element 12. Connection from the electrode 17 is made by way of the thickened metal portion 20 to the surface of the element 14. And, similarly, interconnection from the electrode 25 to electrode 27 which is connected to the P-type region 29 of wafer 13, is by way of the thickened metal portion 26. Except for those portions to which the metal film electrodes are applied, the surface of the semiconductor wafers is covered with a coating of a varying thickness of silicon dioxide as represented by the portions 15, 16 and 28 of the individual wafers 11, 12 and 13, respectively. Typically, the silicon dioxide coating is 8000 angstroms thick but may range from one to twenty thousand angstroms depending on electrical requirements and the character of the oxide. As shown in FIG. 1, the metal interconnections overlie this oxide coating. Each of the thickened metal portions 19, 20 and 26 are built up primarily of gold on a base of titanium and platinum layers. Typically, as set forth in my parent application, the initial layers of titanium and platinum may be about 1000 and 5000 angstroms thick, respectively. The gold layer, on the other hand, is many times thicker and specifically in excess of about 100,000 angstroms. Typically, during the fabrication, the thickness of the semiconductor wafer may be reduced in order to reduce the amount of silicon material which must be removed between elements. Accordingly, the final structure, a portion of which is exemplified by the device 10 on FIG. 1 of the drawing, may comprise a semiconductor portion of one or two mils thickness and in which the individual wafers 11, 12, 13 and 14 are supported in spaced apart array by thick metal portions 19, 20 and 26 which advantageously approach one-half mil in thickness. In particular, thicknesses of the metal portions may range from about 0.25 to one mil depending on the mechanical support required.

A better understanding of the advantages of this particular structure may be gained from an explanation of several alternative modes of fabrication. As indicated above, the initial fabrication steps are conventional and well known in the art, leading to the production of a diffused semiconductor slice on which a coating of silicon oxide has been produced either by any of several modes of vapor deposition or by thermal growth. The oxide-coated surface then is masked using photoresist techniques, and a pattern is developed for depositing the contacting electrodes 17, 18, 25 and 27. The layers of titanium and platinum then are deposited on the masked slice in accordance with the techniques disclosed in my parent application referred to above.

Next, in accordance with one technique, the slice is remasked so as to leave exposed only those areas on which the thick metal portions 19, 20 and 26 are to be formed. A heavy deposition of gold then is made on these unmasked portions to build up the interconnections to sufficient thickness to provide the desired mechanical support. The surface is remasked again, leaving exposed the entire metal interconnection pattern, including the electrode areas 17, 18, 25 and 27. A further thin gold deposition then is made on these unmasked areas to provide a protective gold covering over all the metal film pattern.

It will be understood that the interconnection pattern includes portions extending outwardly from the periphery of the integrated circuit itself. Such extensions or leads provide facile means for making external connections to the integrated circuit.

At this juncture, several other alternatives are available for removing the silicon semiconductor material between the individual semiconductor wafers. In accordance with one method, the opposite face of the slice may be masked using a photoresist technique and the slice then is etched using the standard hydrofluoric-nitric acid etchant used for silicon. This will remove both the silicon and exposed portions of the silicon dioxide but will not attack the metal flap portions 19, 20 and 26. Advantageously, the entire face on which the interconnections are applied is masked using wax or other etch-resistant material. If the material is relatively thick, from three to five mils, this type of etching operation will result in somewhat excessive undercutting of the semiconductor material and allowance must be made therefor in designing the array.

Another procedure is to reduce the thickness of the silicon slice from the three to five mil range to about one to two mils by mechanical or chemical methods. This has the advantage that the thinned slice then is substantially transparent under infrared light and a mask may be readily positioned on the opposite face of the thin slice by simply observing, through the slice with an infrared microscope, registration of the mask in relation to the pattern on the upper surface. Then, as suggested above, an etch-resistant mask may be used in conjunction with an etchant and, inasmuch as the silicon material is thinner, there will be less undercutting and the spacing between elements may be finer.

In another alternative procedure, the mask on the back surface may be of deposited gold and the unmasked silicon material between wafers then is removed by abrasive cutting techniques which are well known in the art. In addition to abrasive cutting, other material removal techniques such as cathode sputtering and electron beam machining may likewise be employed.

The integrated circuit device as produced in accordance with this invention constitutes, after removal of the material between the individual wafers, a structure which may be further cut apart where the entire slice comprises a repetitive design of a number of circuit configurations.

Figure 2:
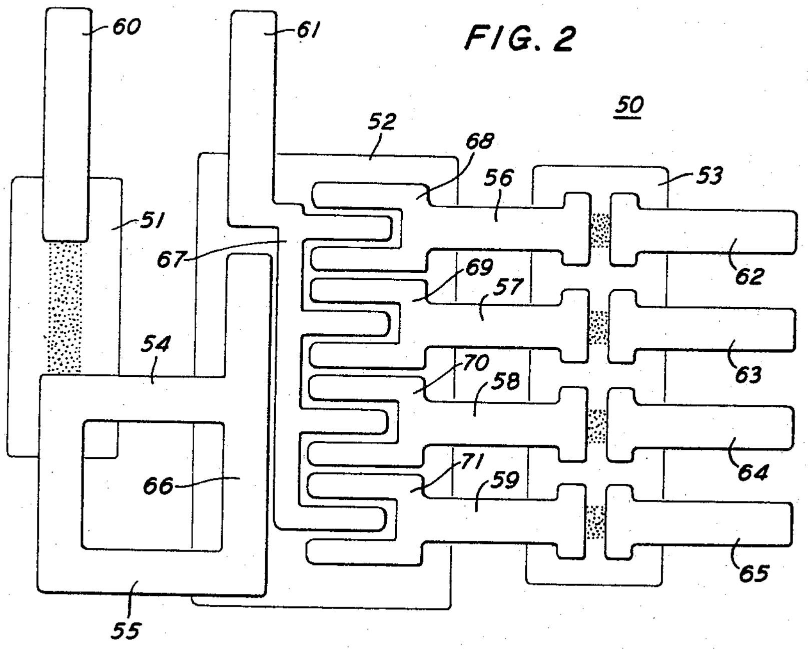
FIG. 2 is a plan view of an integrated circuit element in accordance with this invention.
Figure 3:
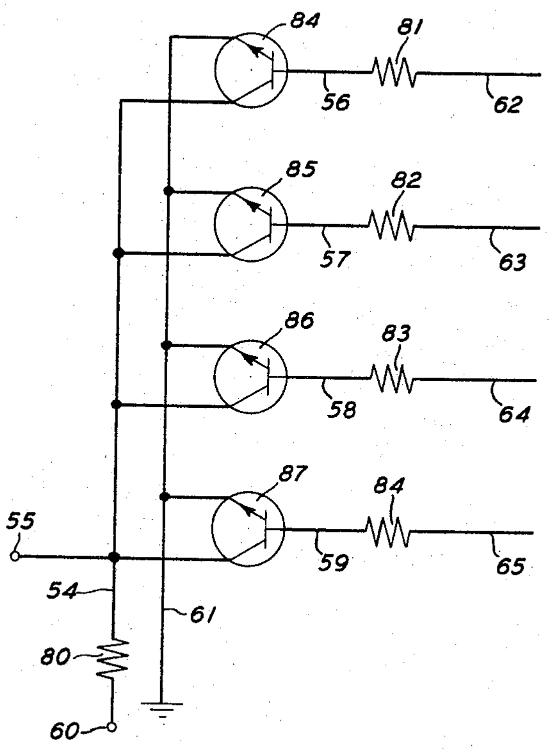
FIG. 3 is a schematic diagram of the circuit of the device of FIG. 2.

Referring to FIG. 2, there is shown a plan view of an integrated circuit device 50 including four transistors and five resistors comprising a modified DCTL or inverted "AND" gate suitable for logic circuitry. Three semicondutcor wafers 51, 52 and 53 are supported in spaced apart array by the heavy metal interconnections 54, 55, 56, 57, 58 and 59. Referring also to FIG. 3, showing the circuit of the device of FIG. 2 and in which, insofar as practicable, identical reference numerals are used, four input interconnections are provided by heavy metal leads 62, 63, 64 and 65 each connected to an input resistor 81, 82, 83 and 84, respectively, in the wafer 53.

Each input lead is connected to a base electrode 68, 69, 70 and 71 of an NPN diffused junction transistor 84, 85, 86 and 87, respectively. The emitters of the transistors are connected through common lead 67 to the external connector 61. The collectors of the four transistors in turn are connected to the common lead 66 which in turn is connected to the resistor 80 in the wafer 51 to which external connection is provided by the lead 60.

The integrated circuit device 50 is produced as a part of a larger number of the same pattern produced from a single slice of semiconductor material. The spacing between the wafers 51, 52 and 53 may be of the order of one-half mil and the entire device has a very high degree of rigidity by reason of the support provided by the heavy metal interconnections. The double strap arrangement 54 and 55 between the common collector connection and the wafer 51 is provided for structural support and as an external connection 55 to the collector.

Although this disclosure is specifically in terms of electronic devices made of semiconductor material, it will be understood that this technique of utilizing deposited metal films of increased thickness for providing integral support may be extended to other substrate compositions. In particular, for example, such procedure may be followed for making thin film devices where the substrate may be ceramic or even a carbon block. Using the heavy metal external lead of the type illustrated in FIG. 2 by the member 60, 61, device structures may be easily fabricated and simply connected to other circuitry by bonding or soldering of the leads themselves to other electrodes or connectors.

Furthermore, it will be understood that the heavy metal portions produced as interconnecting circuits may be formed on both sides of the substrate material. For certain circuit designs, it may be necessary to carry the interconnection across the reverse side of the substrate and a considerable flexibility thus is available in device design. Generally, such a configuration will necessitate chemical etching means for the removal of the intervening semiconductor material in certain high density designs. It may even be necessary to provide lightening holes through the heavy metal portions to permit adequate flow of etchant.

In another aspect of the invention the use of heavy metal connections of a ribbon configuration provides a structure which renders itself readily to incorporation into microwave transmission circuits. The formation of devices in accordance with this invention into transmission lines of the strip type is readily apparent to one skilled in the art.

Finally, although the invention has been disclosed in terms of the specific metals titanium, platinum and gold, it will be understood that alternative metals as suggested in my parent application can likewise be used. Accordingly, although the invention has been disclosed in terms of specific embodiments, it will be understood that other arrangements may be devised by those skilled in the art which also will be within the scope and spirit of the invention.

What is claimed is:

1. A semiconductor integrated circuit device comprising a plurality of semiconductor wafers and conductive interconnection means substantially in one plane and of sufficient thickness to independently support said wafers in a substantially stable configuration.

2. A semiconductor integrated circuit device in accordance with claim 1 in which said conductive interconnection means comprise successive layers of different metals.

3. A semiconductor integrated circuit device in accordance with claim 1 in which said semiconductor wafers have a thickness of from one to two mils and said conductive interconnection means have a thickness of from 0.25 mil to one mil.

4. A semiconductor integrated circuit device in accordance with claim 1 in which said conductive interconnection means comprise substantially a metal selected from the class consisting of gold and silver.

References Cited

UNITED STATES PATENTS 3,158,788 11/1964 Last -------------- 317—101

JOHN W. HUCKERT, *Primary Examiner.*

R. SANDLER, *Assistant Examiner.*